(12) United States Patent
Nam et al.

(10) Patent No.: US 9,660,113 B2
(45) Date of Patent: May 23, 2017

(54) SOLAR CELL APPARATUS AND METHOD OF FABRICATING THE SAME

(71) Applicant: LG INNOTEK CO., LTD., Seoul (KR)

(72) Inventors: Seung Hoon Nam, Seoul (KR); Jung In Jang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/382,324

(22) PCT Filed: Mar. 6, 2013

(86) PCT No.: PCT/KR2013/001824
§ 371 (c)(1),
(2) Date: Sep. 1, 2014

(87) PCT Pub. No.: WO2013/133633
PCT Pub. Date: Sep. 12, 2013

(65) Prior Publication Data
US 2015/0107662 A1    Apr. 23, 2015

(30) Foreign Application Priority Data

Mar. 6, 2012  (KR) .................. 10-2012-0022933

(51) Int. Cl.
*H01L 31/00* (2006.01)
*H01L 31/0236* (2006.01)
(Continued)

(52) U.S. Cl.
CPC ............ *H01L 31/02366* (2013.01); *H01L 31/022466* (2013.01); *H01L 31/0322* (2013.01);
(Continued)

(58) Field of Classification Search
CPC ............. H01L 31/046; H01L 31/0463; H01L 31/0465; H01L 31/0468; H01L 31/0232;
(Continued)

(56) References Cited

U.S. PATENT DOCUMENTS 5,593,901 A * 1/1997 Oswald ........... H01L 31/022425
136/244
2009/0194150 A1* 8/2009 Aoki ............................ 136/252
(Continued)

FOREIGN PATENT DOCUMENTS

CN        101379622 A         3/2009
CN        201435396 Y    *    3/2010
(Continued)

OTHER PUBLICATIONS

Search Report for International Application No. PCT/KR2013/001824.
(Continued)

*Primary Examiner* — Eli Mekhlin
(74) *Attorney, Agent, or Firm* — LRK Patent Law Firm

(57) ABSTRACT

A solar cell apparatus according to the embodiment includes a support substrate including a plurality of patterns; a back electrode layer on the support substrate; a light absorbing layer on the back electrode layer; a buffer layer on the light absorbing layer; and a front electrode layer on the buffer layer, wherein the patterns are formed in an undercut structure including a first inner side surface, a second inner side surface and a bottom surface.

7 Claims, 2 Drawing Sheets

(51) Int. Cl.
*H01L 31/0224* (2006.01)
*H01L 31/032* (2006.01)
*H01L 31/0392* (2006.01)

(52) U.S. Cl.
CPC .... *H01L 31/0392* (2013.01); *H01L 31/03923* (2013.01); *H01L 31/03925* (2013.01); *H01L 31/03926* (2013.01); *Y02E 10/541* (2013.01)

(58) Field of Classification Search
CPC .......... H01L 31/02327; H01L 31/0236; H01L 31/02366; H01L 31/0445
See application file for complete search history.

(56) References Cited

U.S. PATENT DOCUMENTS

| | | | |
|---|---|---|---|
| 2010/0288329 A1* | 11/2010 | Hong et al. | 136/244 |
| 2011/0232744 A1 | 9/2011 | Larsen et al. | |
| 2012/0031454 A1* | 2/2012 | Fogel et al. | 136/244 |

FOREIGN PATENT DOCUMENTS

| | | |
|---|---|---|
| CN | 102315335 A | 1/2012 |
| JP | 2005-197537 A | 7/2005 |
| JP | 2009-295406 A | 12/2009 |
| KR | 10-2009-0068110 A | 6/2009 |
| KR | 10-2010-0037862 A | 4/2010 |
| KR | 10-2011-0001823 A | 1/2011 |
| WO | 2010/025734 A1 | 3/2010 |

OTHER PUBLICATIONS

SIPO Office Action for Chinese Patent Application No. 201380018561.8 which corresponds to the above-identified U.S. application.

* cited by examiner

SOLAR CELL APPARATUS AND METHOD OF FABRICATING THE SAME

TECHNICAL FIELD

The embodiment relates to a solar cell apparatus and a method of fabricating the same.

BACKGROUND ART

A solar cell apparatus for converting sunlight into electrical energy includes a solar cell panel, a diode, and a frame.

The solar cell panel has a plate shape. For example, the solar cell panel has a rectangular plate shape. The solar cell panel is disposed inside the frame. Four side surfaces of the solar cell panel are disposed inside the frame.

The solar cell panel receives sunlight, and converts the sunlight into electrical energy. The solar cell panel includes a plurality of solar cells. The solar cell panel may further include a substrate, a film, or protective glass for protecting the solar cells.

The solar cell panel includes bus bars connected to the solar cells. The bus bars extend from upper surface of outermost solar cells and are connected to wires, respectively.

The diode is connected to the solar cell panel in parallel. A current selectively flows through the diode. That is, when a performance of the solar cell panel deteriorates, a current flows through the diode. Accordingly, a short circuit of the solar cell apparatus according to the embodiment is prevented. The solar cell apparatus may further include wires connected to the diode and the solar cell panel. The wires connect solar cell panels adjacent to each other.

The frame accommodates the solar cell panel therein. The frame is made of a metal. The frame is disposed on a side surface of the solar cell panel. The frame accommodates a side surface of the solar cell panel therein. The frame may include a plurality of sub-frames. In this case, the sub-frames may be connected to each other.

Such a solar cell apparatus is mounted in the outdoor field to convert sunlight into electrical energy. Thus, the solar cell apparatus may be exposed to the external physical impact, electric impact and chemical impact.

A technology related to such a solar cell apparatus is disclosed in Korean Un-examined Patent Publication No. 10-2009-0059529.

Meanwhile, a plurality of patterns, which are electrically connected to each other, are formed in such a solar cell apparatus. When the patterns are formed, a process error may occur and efficiency may be reduced due to a resistance loss.

DISCLOSURE OF INVENTION

Technical Problem

The embodiment provides a solar cell apparatus, in which a plurality of patterns having an undercut structure are formed on a support substrate so that a process of fabricating a solar cell apparatus may be simplified, and a method of fabricating the same.

Solution to Problem

According to the embodiment, there is provided a solar cell apparatus including a support substrate including a plurality of patterns; a back electrode layer on the support substrate; a light absorbing layer on the back electrode layer; a buffer layer on the light absorbing layer; and a front electrode layer on the buffer layer, wherein the patterns are formed in an undercut structure including a first inner side surface, a second inner side surface and a bottom surface.

According to the embodiment, there is provided a method of fabricating a solar cell apparatus. The method includes forming a plurality of patterns on a support substrate; forming a back electrode layer on the support substrate; forming a light absorbing layer on the back electrode layer; forming a buffer layer on the light absorbing layer; and forming a front electrode layer on the buffer layer, wherein the patterns are formed in an undercut structure including a first inner side surface, a second inner side surface and a bottom surface.

Advantageous Effects of Invention

According to the solar cell apparatus of the embodiment, after forming the patterns spaced apart from each other by a predetermined interval on the support substrate, the back electrode layer, the light absorbing layer, the buffer layer, the high resistance buffer layer and the front electrode layer are sequentially formed on the support substrate on which the patterns are formed.

Further, according to the method of fabricating a solar cell apparatus of the embodiment, the pretreatment process is performed to form a plurality of patterns having the undercut shape on the support substrate at a predetermined interval before the step of forming the back electrode layer on the support substrate.

Thus, due to the support substrate formed with the patterns, a process of forming a groove in the back electrode layer after forming the back electrode layer on the support substrate can be omitted.

Therefore, according to the solar cell apparatus and the method of fabricating the same of the embodiment, the module process of the solar cell apparatus may be simplified due to the process omission, so that the process time may be reduced, the process efficiency may be improved and the process cost may be reduced.

MODE FOR THE INVENTION

Figure 1:
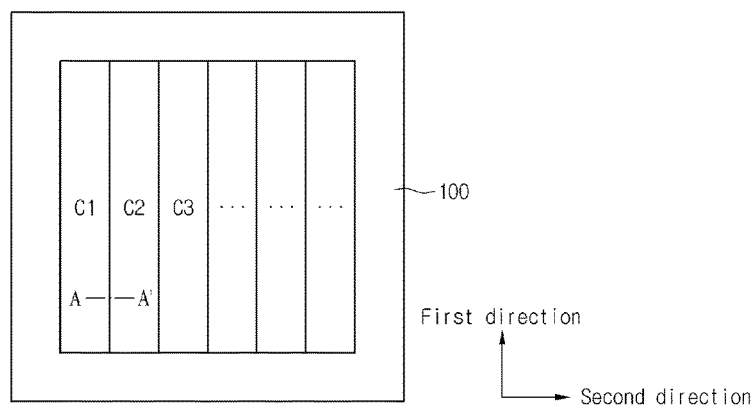
FIG. 1 is a plan view showing a solar cell apparatus according to the embodiment.

In the description of the embodiments, it will be understood that, when a panel, a bar, a frame, a substrate, a recess, or a film is referred to as being "on" or "under" another panel, bar, frame, substrate, recess, or film, it can be "directly" or "indirectly" on the other panel, bar, frame, substrate, recess, or film, or one or more intervening layers may also be present. Such a position of the element described with reference to the drawings.

The thickness and size of each element shown in the drawings may be exaggerated, omitted or schematically drawn for the purpose of convenience or clarity. In addition, the size of elements does not utterly reflect an actual size.

Hereinafter, the embodiment will be described with reference to accompanying drawings.

Figure 2:
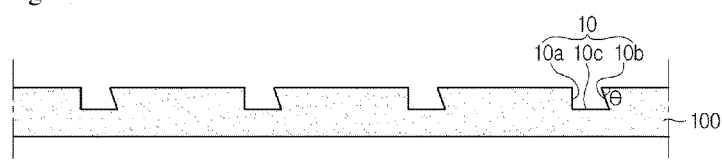
FIGS. 2 and 3 are sectional views showing the solar cell apparatus of FIG. 1.
Figure 3:
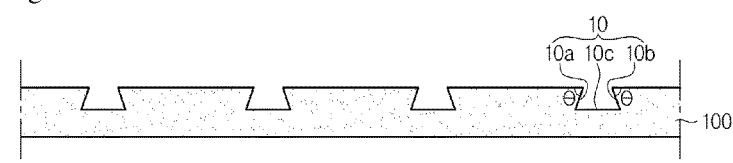
Figure 4:
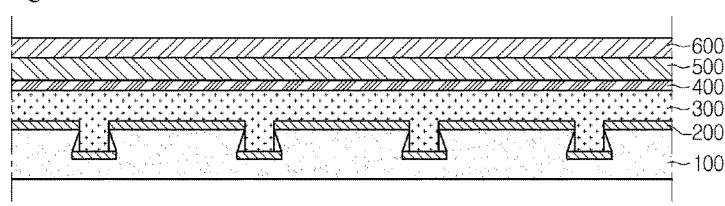
FIG. 4 is a sectional view taken long line A-A' of FIG. 1.

FIG. 1 is a plan view showing a solar cell panel according to the embodiment. FIGS. 2 and 3 are sectional views showing a support substrate according to the embodiment. FIG. 4 is a sectional view taken long line A-A' of FIG. 1.

Referring to FIGS. 1 to 4, the solar cell panel includes a support substrate 100, a back electrode layer 200, a light absorbing layer 300, a buffer layer 400, a high-resistance buffer layer 500, and a front electrode layer 600.

The support substrate 100 has a plate shape, and supports the back electrode layer 200, the light absorbing layer 300, the buffer layer 400, the high resistance buffer layer 500, and the front electrode layer 600.

The support substrate 100 may include an insulator. The support substrate 100 may be a glass substrate, a plastic substrate or a metal substrate. In more detail, the support substrate 100 may be a soda lime glass substrate. The support substrate 100 may be transparent. The support substrate 100 may be flexible or rigid.

The support substrate 100 may include a plurality of patterns. The pattern will be described in detail below.

The back electrode layer 200 is provided on the support substrate 100. The back electrode layer 200 is a conductive layer. For example, a material used for the back electrode 200 may include metal such as molybdenum (Mo).

The back electrode layer 200 may include at least two layers. In this case, each of at least two layers may be formed by using the same metal or different metals.

The light absorbing layer 300 is provided on the back electrode layer 200.

The light absorbing layer 300 includes a group I-III-VI compound. For example, the light absorbing layer 300 may have the CIGSS (Cu(IN,Ga)(Se,S)$_2$) crystal structure, the CISS (Cu(IN)(Se,S)$_2$) crystal structure or the CGSS (Cu(Ga)(Se,S)$_2$) crystal structure.

The light absorbing layer 300 may have an energy bandgap in the range of about 1 eV to about 1.8 eV.

The buffer layer 400 is provided on the light absorbing layer 300. The buffer layer 400 makes direct contact with the light absorbing layer 300.

The high resistance buffer layer 500 may be provided on the buffer layer 400. The high resistance buffer layer 500 includes zinc oxide (i-ZnO) which is not doped with impurities. The energy bandgap of the high resistance buffer layer 500 may be in the range of about 3.1 eV to about 3.3 eV.

The front electrode layer 600 is provided on the light absorbing layer 300. In more detail, the front electrode layer 600 is provided on the high resistance buffer layer 500.

The front electrode layer 600 is provided on the high resistance buffer layer 500. The front electrode layer 600 is transparent. For example, a material used for the front electrode layer 600 may include an Al doped zinc oxide (AZO), an indium zinc oxide (IZO), or an indium tin oxide (ITO).

A thickness of the front electrode layer 600 may be in the range of about 500 nm to about 1.5 μm. When the front electrode layer 600 is formed of aluminum doped zinc oxide (AZO), the aluminum (Al) may be doped at the amount of about 2.5 wt % to about 3.5 wt %. The front electrode layer 600 is a conductive layer.

Hereinafter, the support substrate 100 will be described in more detail with reference to the drawings.

Referring to FIGS. 2 and 3, the support substrate 100 may include the plurality of patterns. The patterns 10 may be spaced apart from each other by a predetermined interval. In detail, the pattern 10 may be formed in an undercut structure on the support substrate 100.

The pattern may be fabricated through an etching, a needle or an injection-molding scheme. Preferably, when the substrate may be a glass substrate, the pattern of the undercut structure may be formed on the glass substrate through a mechanical machining using an etching or a needle. When the substrate may be a plastic or metal substrate, the pattern of the undercut structure may be formed through the injection-molding scheme. However, the embodiment is not limited to the above, and various methods through which the pattern may be formed on the support substrate may be utilized.

The pattern 10 having the undercut structure may include a first inner side surface 10a, a second inner side surface 10b and a bottom surface 10c.

The first inner side surface 10a and the second inner side surface 10b may face each other. Further, the bottom surface 10c may connect the first inner side surface 10a to the second inner side surface 10b.

One of the first and second inner side surfaces 10a and 10b may be inclined with respect to a top surface of the support substrate 100. Or, both of the first and second inner side surfaces 10a and 10b may be inclined with respect to the top surface of the support substrate 100. That is, the shape of the pattern may be formed such that one of the first and second inner side surfaces 10a and 10b may be inclined as shown in FIG. 2 or both of the first and second inner side surfaces 10a and 10b may be inclined, as shown in FIG. 3, to the top surface of the support substrate 100.

Further, one of the first and second inner side surfaces 10a and 10b may be perpendicular to the top surface of the support substrate 100. That is, as shown in FIG. 2, the first inner side surfaces 10a may be perpendicular to the top surface of the support substrate 100 and the second inner side surfaces 10b may be inclined with respect to the top surface of the support substrate 100.

When both of the first and second inner side surfaces 10a and 10b may be inclined with respect to the top surface of the support substrate 100, an electrically shot circuit may be effectively prevented. When one of the first and second inner side surfaces 10a and 10b may be inclined with respect to the top surface of the support substrate 100, a dead area may be reduced so that the efficiency may be improved.

When the first and/or second inner side surfaces 10a and/or 10b are inclined, a distance between the first and second inner side surfaces 10a and 10b may be gradually increased downward from the top surface of the support substrate 100. That is, the first and/or second inner side surfaces 10a and/or 10b may be inclined in a direction in which the distance between the first and second inner side surfaces 10a and 10b may be gradually increased from the top surface of the support substrate 100 to the pattern, that is, the bottom surface 10c of the undercut structure. In other words, the first and second inner side surfaces 10a and 10b may be inclined in mutually opposite directions, respectively. For example, when the first and second inner side surfaces 10a and 10b are inclined, the undercut structure may have a trapezoid shape.

When the first and/or second inner side surface 10a and/or 10b is inclined, an angle (θ) between the top surface of the support substrate 100 and the first and/or second inner side surface 10a and/or 10b may be in the range of 10° to 80°. However, the angle (θ) is not limited to the above, and the angle (θ) may be properly adjusted by taking into consideration a danger of an electric short circuit and efficiency of the solar cell apparatus.

The back electrode layer 200 may be provided on the support substrate 100 in which the pattern 10 having the undercut structure including the first and second inner side surfaces 10a and 10b and the bottom surface 10c is formed. The back electrode layer 200 may be disposed such that the back electrode layer 200 makes direct contact with the top surface of the support substrate 100 and the pattern, that is, the bottom surface 10c of the undercut structure.

Further, the light absorbing layer 300 provided on the back electrode layer 200 may be disposed such that the light absorbing layer 300 makes direct contact with the top surface of the back electrode layer 200 and a portion or the whole of the back electrode layer 200 disposed on the bottom surface 10c.

According to the solar cell apparatus of the embodiment, after forming the patterns spaced apart from each other by a predetermined interval on the support substrate, the back electrode layer, the light absorbing layer, the buffer layer, the high resistance buffer layer and the front electrode layer are sequentially formed on the support substrate on which the patterns are formed.

Therefore, the module process of the solar cell apparatus may be simplified due to the process omission, so that the process time may be reduced, the process efficiency may be improved and the process cost may be reduced.

Hereinafter, a method of fabricating a solar cell apparatus according to the embodiment will be described with reference to FIGS. 5 to 9. In the following description, the details of structures and components the same as those of the solar cell apparatus or extremely similar to those of the solar cell apparatus will be omitted for the purpose of clear and simple explanation.

The method of fabricating a solar cell apparatus according to the embodiment is sequentially depicted in FIGS. 5 to 9.

The method of fabricating a solar cell apparatus according to the embodiment includes the steps of forming a plurality of patterns on a support substrate; forming a back electrode layer on the support substrate; forming a light absorbing layer on the back electrode layer; forming a buffer layer on the light absorbing layer; and forming a front electrode layer on the buffer layer, wherein the patterns are formed in an undercut structure such that each of the patterns includes a first inner side surface, a second inner side surface and a bottom surface.

Figure 5:
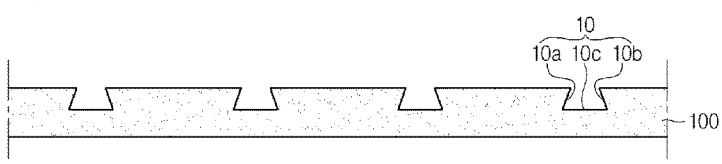
FIGS. 5 to 9 are views illustrating a process of fabricating a solar cell apparatus according to the embodiment.

In the step of forming the patterns on the support substrate, the pattern of the undercut structure may be formed on the support substrate. As shown in FIG. 5, the undercut may include the first and second inner side surfaces 10a and 10b and the bottom surface 10c.

The first and second inner side surfaces 10a and 10b face each other, and the bottom surface 10c is connected to the first and second inner side surfaces 10a and 10b.

The first and/or second inner side surfaces 10a and/or 10b may be inclined or perpendicular to the top surface of the support substrate. The first and/or second inner side surface 10a and/or 10b may be inclined, such that the distance between first and/or second inner side surface 10a and/or 10b is gradually increased downward from the top surface of the support substrate. That is, the first and second inner side surfaces 10a and 10b may be inclined in mutually opposite directions, respectively. For example, the pattern may have a trapezoid shape.

The pattern may be formed through an etching process. For example, when the support substrate 100 may be a glass substrate, the pattern may be formed through the etching process or by using a needle. When the support substrate 100 may be a plastic or metallic substrate, the pattern may be formed of the support substrate 100 through an injection-molding scheme.

Figure 6:
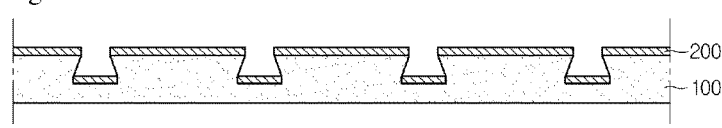

In the step of forming the back electrode layer on the support substrate, the back electrode layer 200 may be formed on the support substrate 100. The back electrode layer 200 may be formed through a PVD (Physical Vapor Deposition) scheme or a plating scheme. As shown in FIG. 6, the back electrode layer 200 may be formed on the support substrate 100 such that the back electrode layer 200 makes direct contact with the top surface of the support substrate 100 and the pattern, that is, the bottom surface 10c of the undercut of the support substrate 100.

Then, in the step of forming the light absorbing layer on the back electrode layer, the light absorbing layer 300 For example, in order to form the light absorbing layer 300, a method of forming a copper-indium-gallium-selenium-based (Cu(In,Ga)(Se)$_2$; CIGS-based) light absorbing layer 300 while simultaneously or separately evaporating copper, indium, gallium, and selenium and a method for performing a selenization process after a metallic precursor layer has been formed are widely used.

Regarding the details of the selenization process after the formation of the metallic precursor layer, the metallic precursor layer is formed on the back electrode layer 200 through a sputtering process employing a Cu target, an In target, and a Ga target. Thereafter, the metallic precursor layer is subject to the selenization process so that the Cu (In, Ga) Se2 (CIGS) based light absorbing layer 300 is formed.

As an alternative, the sputter process and the selenization process using the copper target, the indium target, and the gallium target may be performed at the same time. As another alternative, a CIS-based or CIG-based light absorbing layer 300 may be formed through a sputtering process or a selenization process by using only a copper target or an indium target, or by using a copper target and a gallium target.

Figure 7:
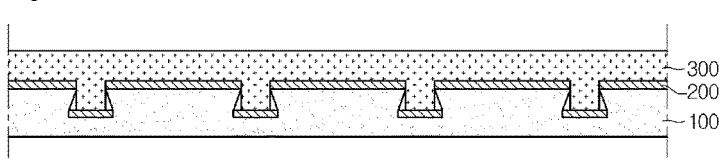

As shown in FIG. 7, the light absorbing layer 300 may make direct contact with the top surface of the back electrode layer 200 and a portion or the whole of the back electrode layer 200 disposed on the bottom surface 10c.

Then, in the steps of forming the buffer layer on the light absorbing layer and forming the front electrode layer on the buffer layer, the buffer layer 400 and the high resistance buffer layer 500 are formed on the light absorbing layer 300, and the front electrode layer 600 is formed on the buffer layer.

Figure 8:
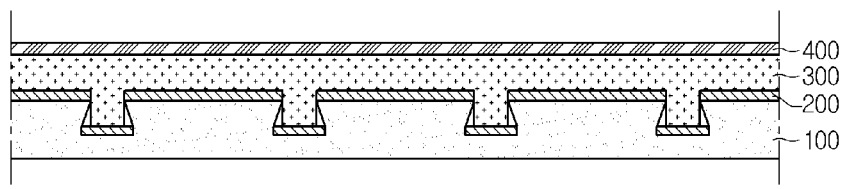
Figure 9:
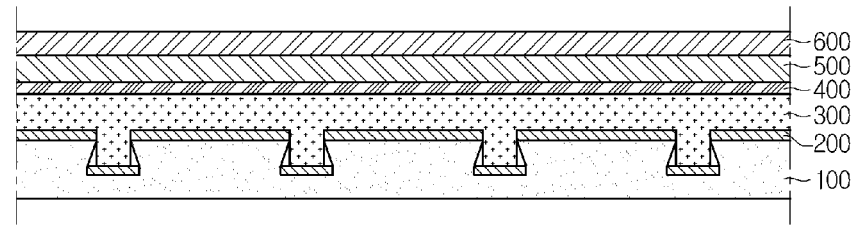

As shown in FIGS. 8 and 9, the buffer layer and the high resistance buffer layer 500 may be formed on the light absorbing layer 300. The buffer layer 400 may be formed by depositing CdS on the light absorbing layer 300 through a chemical bath deposition (CBD) scheme. Further, zinc oxide is deposited on the buffer layer 400 through the sputtering process, thereby forming the high resistance buffer layer 500.

Then, the front electrode layer 600 is provided on the high resistance buffer layer 500. A transparent conductive material is deposited on the high resistance buffer layer 500 such that the front electrode layer 600 is formed. For example, the transparent conductive material may include zinc oxide doped with aluminum (Al) or boron (B). The front electrode layer 600 may be formed by sputtering the zinc oxide doped with aluminum (Al) or boron (B).

As described above, according to the method of fabricating a solar cell apparatus of the embodiment, the pretreatment process is performed to form a plurality of patterns having the undercut shape on the support substrate at a predetermined interval before the step of forming the back electrode layer on the support substrate.

Thus, due to the support substrate formed with the patterns, a process of forming a groove in the back electrode layer after forming the back electrode layer on the support substrate can be omitted.

Therefore, according to the solar cell apparatus and the method of fabricating the same of the embodiment, the module process of the solar cell apparatus may be simplified due to the process omission, so that the process time may be reduced, the process efficiency may be improved and the process cost may be reduced.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although the embodiments have been mainly described until now, they are just exemplary and do not limit the present invention. Thus, those skilled in the art to which the present invention pertains will know that various modifications and applications which have not been exemplified may be carried out within a range which does not deviate from the essential characteristics of the embodiments. For example, the constituent elements described in detail in the exemplary embodiments can be modified to be carried out. Further, the differences related to such modifications and applications shall be construed to be included in the scope of the present invention specified in the attached claims.

The invention claimed is:

1. A solar cell apparatus comprising:
a support substrate;
a molybdenum (Mo) layer on the support substrate;
a light absorbing layer on the molybdenum (Mo) layer;
a buffer layer on the light absorbing layer; and
a front electrode layer on the buffer layer,
wherein a top surface of the support substrate includes a plurality of grooves and a flat surface,
wherein the plurality of grooves are formed under the flat surface, each of the grooves including a first inner side surface, a second inner side surface and a bottom surface,
wherein at least one of the first inner side surface and the second inner side surface is inclined with respect to the flat surface of the support substrate,
wherein a distance between the first inner side surface and the second inner side surface is gradually increased from the top surface of the support substrate to a bottom surface of the support substrate,
wherein the molybdenum (Mo) layer includes:
a first molybdenum (Mo) layer on the flat surface; and
a second molybdenum (Mo) layer on the bottom surface,
wherein the first molybdenum (Mo) layer is spaced apart from the second molybdenum (Mo) layer,
wherein the light absorbing layer makes direct contact with a top surface and a side surface of the first molybdenum (Mo) layer and a portion or a whole of the second molybdenum (Mo) layer disposed on the bottom surface of the groove,
wherein the light absorbing layer is spaced apart from a side surface of the second molybdenum (Mo) layer, and
wherein the first molybdenum (Mo) layer is electrically disconnected from the second molybdenum (Mo) layer.

2. The solar cell apparatus of claim 1, wherein an angle between the first inner side surface and the top surface of the support substrate or the second inner side surface and the top surface of the support substrate is in a range of 10° to 80°.

3. The solar cell apparatus of claim 1, wherein the first and second inner side surfaces are inclined with respect to a top surface of the support substrate.

4. The solar cell apparatus of claim 3, wherein angles between the first inner side surface and the top surface of the support substrate are the second inner side surface and the top surface of the support substrate are in a range of 10° to 80°.

5. The solar cell apparatus of claim 1, wherein one of the first and second inner side surfaces is perpendicular to a top surface of the support substrate.

6. The solar cell apparatus of claim 1, wherein the molybdenum (Mo) layer makes direct contact with a top surface of the support substrate and the bottom surface of the groove.

7. The solar cell apparatus of claim 1, wherein the plurality of grooves are spaced apart from each other by a same predetermined interval.

* * * * *